United States Patent
Bash et al.

(10) Patent No.: US 8,491,702 B2
(45) Date of Patent: Jul. 23, 2013

(54) MOISTURE CONTENT CONTROL SYSTEM

(75) Inventors: Cullen E. Bash, Los Gatos, CA (US); Amip J. Shah, Mountain View, CA (US); Ratnesh Kumar Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 309 days.

(21) Appl. No.: 12/744,902

(22) PCT Filed: Dec. 21, 2007

(86) PCT No.: PCT/US2007/088626
§ 371 (c)(1),
(2), (4) Date: May 26, 2010

(87) PCT Pub. No.: WO2009/082401
PCT Pub. Date: Jul. 2, 2009

(65) Prior Publication Data
US 2010/0300284 A1      Dec. 2, 2010

(51) Int. Cl.
*G05D 22/00* (2006.01)
*F24F 11/00* (2006.01)

(52) U.S. Cl.
USPC .............. 95/10; 62/176.1; 454/184; 454/256; 236/44 R; 700/276

(58) Field of Classification Search
USPC .......... 95/10, 90; 96/111; 62/176.1; 454/256, 454/184; 236/44 R, 44 A; 700/276
See application file for complete search history.

(56) References Cited

U.S. PATENT DOCUMENTS

| | | | |
|---|---|---|---|
| 5,090,972 A * | 2/1992 | Eller et al. | 95/10 |
| 5,353,862 A | 10/1994 | Akiyama | |
| 5,607,647 A * | 3/1997 | Kinkead | 422/122 |
| 6,220,039 B1 * | 4/2001 | Kensok et al. | 62/93 |
| 7,640,760 B2 * | 1/2010 | Bash et al. | 62/178 |
| 2003/0200050 A1 | 10/2003 | Sharma | |
| 2006/0100744 A1 * | 5/2006 | Sharma et al. | 700/276 |
| 2006/0206291 A1 | 9/2006 | Bash et al. | |

FOREIGN PATENT DOCUMENTS

| | | |
|---|---|---|
| EP | 0710804 | 5/1996 |
| JP | S60-057811 | 4/1985 |
| JP | 05-026559 A | 2/1993 |

(Continued)

OTHER PUBLICATIONS

European Search Report received in EP Application No. 07869793.5, mailed Mar. 29, 2012, pp. 9.

(Continued)

*Primary Examiner* — Frank Lawrence, Jr.

(57) ABSTRACT

A system for controlling moisture content in ambient airflow in a substantially enclosed structure having components. The system includes at least one humidity control apparatus and a plurality of sensors for detecting moisture content in airflow in a plurality of locations of the substantially enclosed structure. The plurality of sensors are located remotely from the at least one humidity control apparatus and are situated in relatively close proximity to the components that the at least one humidity control apparatus is configured to affect. The system also includes a controller configured to receive moisture content levels detected by one or more of the plurality of sensors and to control the at least one humidity control apparatus based upon the detected moisture content levels to vary the moisture content in the ambient airflow around the plurality of locations.

21 Claims, 6 Drawing Sheets

| FOREIGN PATENT DOCUMENTS | | |
|---|---|---|
| JP | 05-248683 | 9/1993 |
| JP | 06-074518 | 3/1994 |
| JP | 2001-272086 | 10/2001 |
| KR | 10-1999-0083690 A | 12/1999 |
| WO | WO 2006/052708 A1 | 5/2006 |

OTHER PUBLICATIONS

International Search Report and Written Opinion received in PCT Application No. PCT/US2007/088626, mailed Sep. 9, 2008, pp. 9.

* cited by examiner

MOISTURE CONTENT CONTROL SYSTEM

BACKGROUND

A data center may be defined as a location, for instance, a room, that houses computer systems arranged in a number of racks. A standard rack or an electronics cabinet is defined as an Electronics Industry Association (EIA) enclosure, 78 in. (2 meters) high, 24 in. (0.61 meter) wide and 30 in. (0.76 meter) deep. These racks are configured to house a number of computer systems, about forty (40) to 200 or more systems. The computer systems typically include a number of printed circuit boards (PCBs), mass storage devices, power supplies, processors, micro-controllers, and semi-conductor devices that dissipate relatively significant amounts of heat during their operation.

One or more air conditioning (AC) units are typically employed to supply cooling airflow to dissipate the heat generated by the computer systems. It is beneficial to control the moisture content in the airflow supplied by the AC units because too much moisture increases the risk of condensation forming on the computer systems and too little moisture increases the risk of electrostatic discharge issues. In order to substantially maintain the moisture content within a desired range, the AC units are often equipped with a humidifier/dehumidifier configured to add or remove moisture content in the cooling airflow. AC units equipped with these devices are also typically equipped with humidity sensors positioned at the returns to detect the relative humidity of the airflow returning into the AC units through returns. In addition, the AC units control the moisture content of the cooling airflow to meet a predetermined relative humidity set point at the returns.

If designed and arranged appropriately, and if the desired relative humidity range is broad, such as, between 20%-80%, the AC units are typically capable of maintaining the relative humidity levels within the desired range. However, because the humidity control is based only on the relative humidity detected at the returns of the AC units and because relative humidity is a function of temperature, when there is a problem, such as, if one of the AC units supplies overly cool airflow, certain areas of the data center may receive the cooler air, which may lead to the formation of condensation in those areas. In addition, the AC units may operate in relatively energy inefficient manners because one AC unit may be humidifying while another AC unit is dehumidifying in supplying cool airflow to the same areas in the data center.

It would thus be desirable to have humidity control in a structure, such as, a data center, without suffering from the drawbacks and disadvantages associated with conventional humidity control arrangements.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are systems and methods for controlling moisture content in ambient airflow in a substantially enclosed structure. The systems and methods disclosed herein include the use of at least one humidity control apparatus and a plurality of sensors for detecting moisture content in airflow in a plurality of locations of the substantially enclosed structure. The plurality of sensors are located remotely from the at least one humidity control apparatus and are situated in relatively close proximity to the components that the at least one humidity control apparatus is configured to affect. The terms "located remotely", as well as examples of configurations where the plurality of sensors are located remotely from the at least one humidity control apparatus are presented herein below.

Through implementation of the systems and methods disclosed herein, the humidity levels in the substantially enclosed structure may be detected at the locations where humidity control is to be provided. In addition, one or more humidity control apparatuses may be actuated to vary the humidity levels of the airflow supplied to those locations. As such, electronic components positioned at those locations may be maintained under desired environmental conditions, which may increase their reliabilities as well as increase energy efficiency in operating the one or more humidity control apparatuses.

Figure 1A:
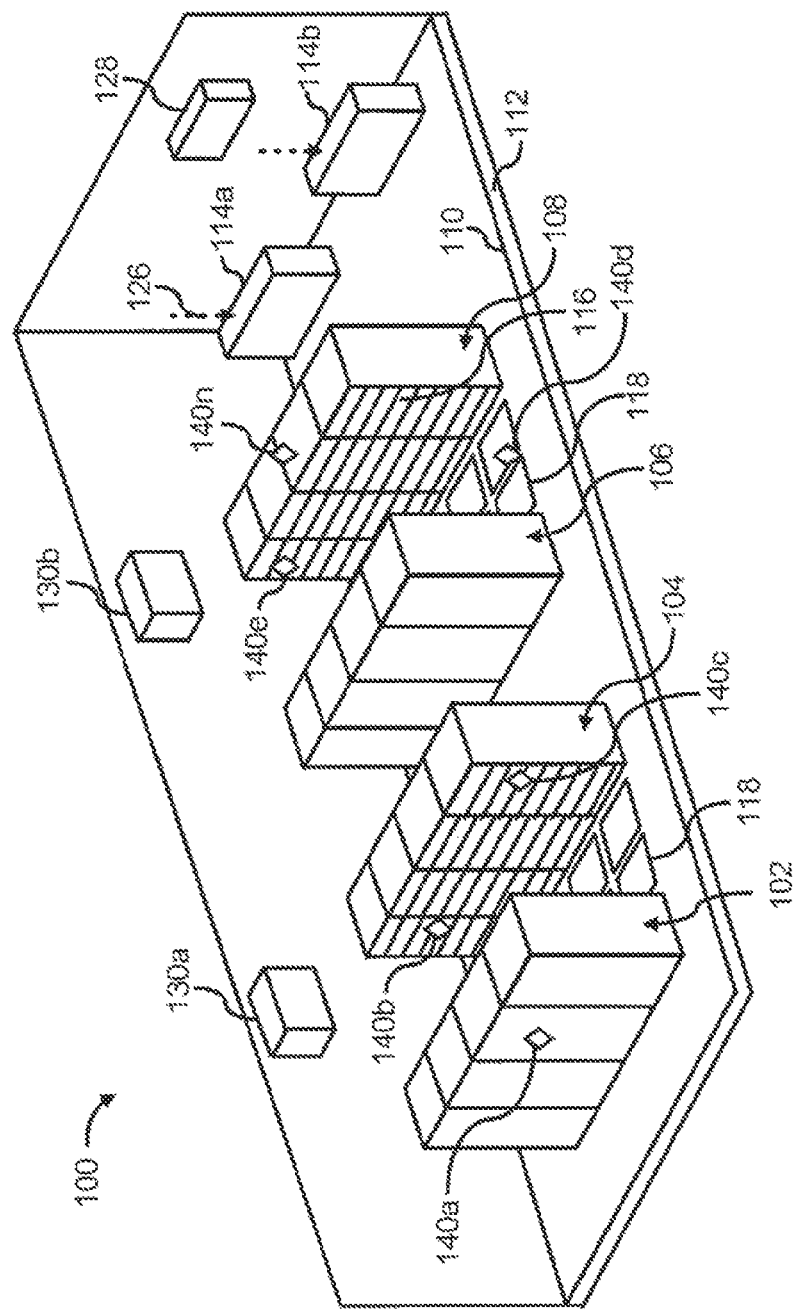
FIG. 1A shows a simplified perspective view of a portion of a substantially enclosed structure in which various examples of the invention may be practiced, according to an embodiment of the invention.

With reference first to FIG. 1A, there is shown a simplified perspective view of a portion of a substantially enclosed structure 100 in which various examples of the invention may be practiced. The substantially enclosed structure 100 may comprise any reasonably suitable type of substantially enclosed structure, such as, a building, a room, a container, etc. As such, the terms "substantially enclosed" are intended to encompass structures whose environments may substantially be controlled. In this regard, the substantially enclosed structure 100 need not be completely sealed off from an outside environment, but may have some level of influence from an outside environment. In fact, air conditioning unit(s)

may be configured to draw in some amount of external, makeup, airflow into the substantially enclosed structure 100.

According to an example, the substantially enclosed structure 100 depicted in FIG. 1A comprises a data center having computing, cooling control, and humidity control equipment. The terms "data center" are generally meant to denote a room or other space where one or more electronic components may be situated. It should be readily apparent to those of ordinary skill in the art that the substantially enclosed structure 100 depicted in FIG. 1 represents a generalized illustration and that other components may be added or existing components may be removed or modified without departing from the scope of the invention. In addition, although particular reference is made throughout the present disclosure to the substantially enclosed structure 100 as comprising a data center, it should be understood that the substantially enclosed structure 100 may comprise other types of structures as discussed herein above.

The substantially enclosed structure 100 is depicted as having a plurality of racks 102-108, for instance, electronics cabinets, aligned in parallel rows. Each of the rows of racks 102-108 is shown as containing four racks positioned on a raised floor 110. A plurality of wires and communication lines (not shown) may be located in a space 112 beneath the raised floor 110. The space 112 may also function as a plenum for delivery of cooled airflow from one or more air conditioning (AC) units 114a-114n, where n is an integer greater than one, (only AC units 114a and 114b are shown) to the racks 102-108. The cooled airflow may be delivered from the space 112 to the racks 102-108 through vent tiles 118 located between some or all of the racks 102-108.

The racks 102-108 are generally configured to house a plurality of electronic components 116, for instance, processors, micro-controllers, high-speed video cards, memories, semi-conductor devices, and the like. The electronic components 116 may be elements of a plurality of subsystems (not shown), for instance, computers, servers, bladed servers, etc. The subsystems and the components may be implemented to perform various electronic, for instance, computing, switching, routing, displaying, and the like, functions.

The sides of the racks 102-108 that face the vent tiles 118 may be considered as the fronts or the inlets of the racks and the sides of the racks 102-108 that face away from the vent tiles 118 may be considered as the rears or the exhausts of the racks 102-108. For purposes of simplicity and not of limitation, this nomenclature will be relied upon throughout the present disclosure to describe the various sides of the racks 102-108.

The AC units 114a-114n are generally operated to cool received heated air as indicated by the arrows 126 and to supply the cooled air into the space 112. Although not explicitly depicted in FIG. 1A, the AC units 114a-114n may also draw in makeup airflow externally from the substantially enclosed structure 100. In various instances, the AC units 114a-114n include devices for humidifying and/or dehumidifying the airflow prior to supplying the cooled airflow into the space 112. In these instances, the AC units 114a-114n may be operated to either increase or decrease moisture levels in the airflow supplied into the space 112 based upon, for instance, relative humidity set points, temperature set points, or both, that the AC units 114a-114n are programmed to achieve in cooling and/or humidifying the airflow. In this regard, when an AC unit 114a is controlling relative humidity, an increase in temperature set point typically drives the AC unit 114a into humidification while a decrease in temperature set point typically forces the AC unit 114a into dehumidification.

Also shown in FIG. 1 are humidity control apparatuses 130a-130n, where n is an integer greater than one (only 130a and 130b are shown). Generally speaking, the humidity control apparatuses 130a-130n are configured to vary the moisture content in the airflow supplied to one or more locations in the substantially enclosed structure 100. In other words, the humidity control apparatuses are configured to receive airflow, vary the moisture content in the received airflow, and to output the airflow with the varied moisture content. In addition, the humidity control apparatuses 130a-130n may draw in makeup airflow externally from the substantially enclosed structure 100 and may vary the moisture content of the makeup airflow in addition to the airflow received from the substantially enclosed structure 100.

In the example depicted in FIG. 1A, the humidity control apparatuses 130a-130n comprise separate and distinct components from the AC units 114a-114n. According to other examples, however, one or more of the humidity control apparatuses 130a-130n may be integrated with the AC units 114a-114n and may thus comprise the humidifying and/or dehumidifying devices discussed above. In addition, although the humidity control apparatuses 130a-130n have been depicted as being elevated from the raised floor 110, the humidity control apparatuses 130a-130n may be positioned on the raised floor 110 and may supply airflow into the space 112, similarly to the AC units 114a-114n.

Either or both of the AC units 114-114n and the humidity control apparatuses 130a-130n may be controlled by a controller 128. In one regard, the controller 128 may control the AC units 114a-114n to vary the temperature, humidity levels, and volume flow rates of the air supplied by the AC units 114a-114n. In addition, or alternatively, the controller 128 may control the humidity control apparatuses 130a-130n to vary the moisture content levels in the airflow supplied by the humidity control apparatuses 130a-130n. The controller 128 is described in greater detail herein below with respect to FIG. 2.

In controlling either or both of the AC units 114a-114n, the controller 128 may receive sensed humidity data from a plurality of humidity sensors 140a-140n, where n is an integer greater than one and is not necessarily the same value as the "n" in reference numerals 114n, 130n, and 132n, which may also differ among each other. The humidity sensors 140a-140n may comprise any reasonably suitable type of humidity sensor, such as, hygrometers, psychrometers, etc. In addition, the humidity sensors 140a-140n are configured to communicate the sensed data to the controller 128 through any reasonably suitable manner, for instance, through a wired network, over a wireless network, etc.

The humidity sensors 140a-140n are depicted as having diamond shapes to distinguish them from other features shown in FIG. 1A. In addition, the humidity sensors 140a-140n are depicted as being located at various positions throughout the substantially enclosed structure 100. For instance, some of the humidity sensors 140a-140c are depicted as being positioned along either the inlets or the outlets of the racks 102-108. Another humidity sensor 140d is depicted as being positioned near a vent tile 118. A further humidity sensor 140n is depicted as being positioned on top of a rack 108. It should be understood that the humidity sensors 140a-140n may be positioned at any reasonably suitable location in the substantially enclosed structure 100, so long as the humidity sensors 140a-140n are located remotely from the humidity control apparatuses 130a-130n and the AC units 114a-114n as described in greater detail herein below.

The substantially enclosed structure 100 is illustrated in FIG. 1A as containing four rows of racks 102-108, two AC units 114*a*, 114*b*, and two humidity control apparatuses 130*a*, 130*b* for purposes of simplicity and illustration. Thus, the substantially enclosed structure 100 should not be limited in any respect based upon the number of racks 102-108, AC units 114*a*, 114*b*, and humidity control apparatuses 130*a*, 130*b* illustrated in FIG. 1A. In addition, although the racks 102-108 have all been illustrated similarly, the racks 102-108 may comprise heterogeneous configurations. For instance, the racks 102-108 may be manufactured by different companies or the racks 102-108 may be designed to house differing types of electronic components 116, for example, horizontally mounted servers, bladed servers, etc.

Figure 1B:
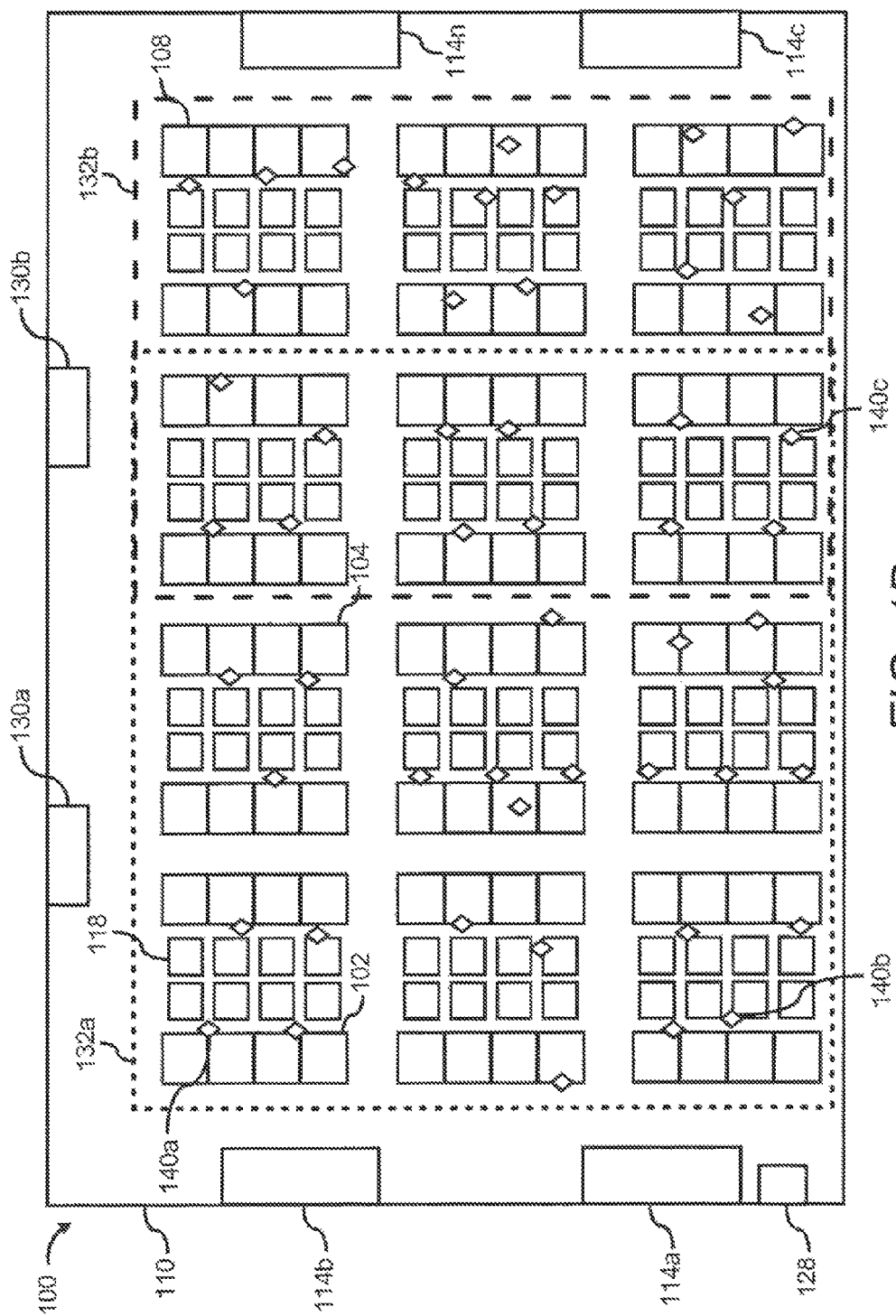
FIG. 1B shows a simplified plan view of the substantially enclosed structure depicted in FIG. 1A, according to an embodiment of the invention.

With reference now to FIG. 1B, there is shown a simplified plan view of the substantially enclosed structure 100 depicted in FIG. 1A. The substantially enclosed structure 100 is depicted as including AC units 114*a*-114*n* positioned at various locations throughout the substantially enclosed structure 100. A plurality of vent tiles 118 are also illustrated in FIG. 1B and are configured to deliver cooled airflow to the racks 102-108 as described above.

As described herein above, the vent tiles 118 and the racks 102-108 are positioned on a raised floor 110, beneath which lies the space 112 (FIG. 1A). Also depicted in FIG. 1B are humidity control apparatuses 130*a*-130*n* (only 130*a* and 130*b* are shown). According to a first example, a single humidity control apparatus 130*a* may be implemented to vary the moisture content in the ambient airflow contained in the substantially enclosed structure 100. According to another example, a plurality of humidity control apparatuses 130*a*-130*n* may be implemented to vary the moisture content in respective areas or zones in the substantially enclosed structure 100. In the latter example, the zones affected by the plurality of humidity control apparatuses 130*a*-130*n* may be made to be substantially distinct from each other, for instance, through use of partitions, airflow rates, etc, or the zones may overlap with each other.

The substantially enclosed structure 100 is depicted with a box formed of dotted lines 132*a* and a box formed of dashed lines 132*b*, which represent zones respectively associated with the humidity control apparatuses 130*a* and 130*b*. The respective zones 132*a* and 132*b* may be identified based upon the proximities of the humidity sensors 140*a*-140*n* to respective humidity control apparatuses 130*a*-130*n*. In addition, or alternatively, the respective zones 132*a* and 132*b* may be identified through a commissioning process, which is described in greater detail herein below. The identification of the zones 132*a* and 132*b* may result in some or all of the humidity sensors 140*a*-140*n* being contained in multiple zones 132*a* and 132*b* as shown in FIG. 1B. The zones 132*a* and 132*b* have been depicted as having rectangular shapes for purposes of simplicity only and it should therefore be understood that the zones 132*a* and 132*b* may be identified as having any reasonably suitable shape based upon, for instance, implementation of a commissioning process discussed below.

Also disclosed in greater detail herein below are various manners in which the humidity control apparatuses 130*a*-130*n* may be controlled by the controller 128 based upon input received from the humidity sensors 140*a*-140*n*, which are illustrated as being positioned at various locations with respect to the racks 102-108 and other components in the substantially enclosed structure 100.

Figure 2:
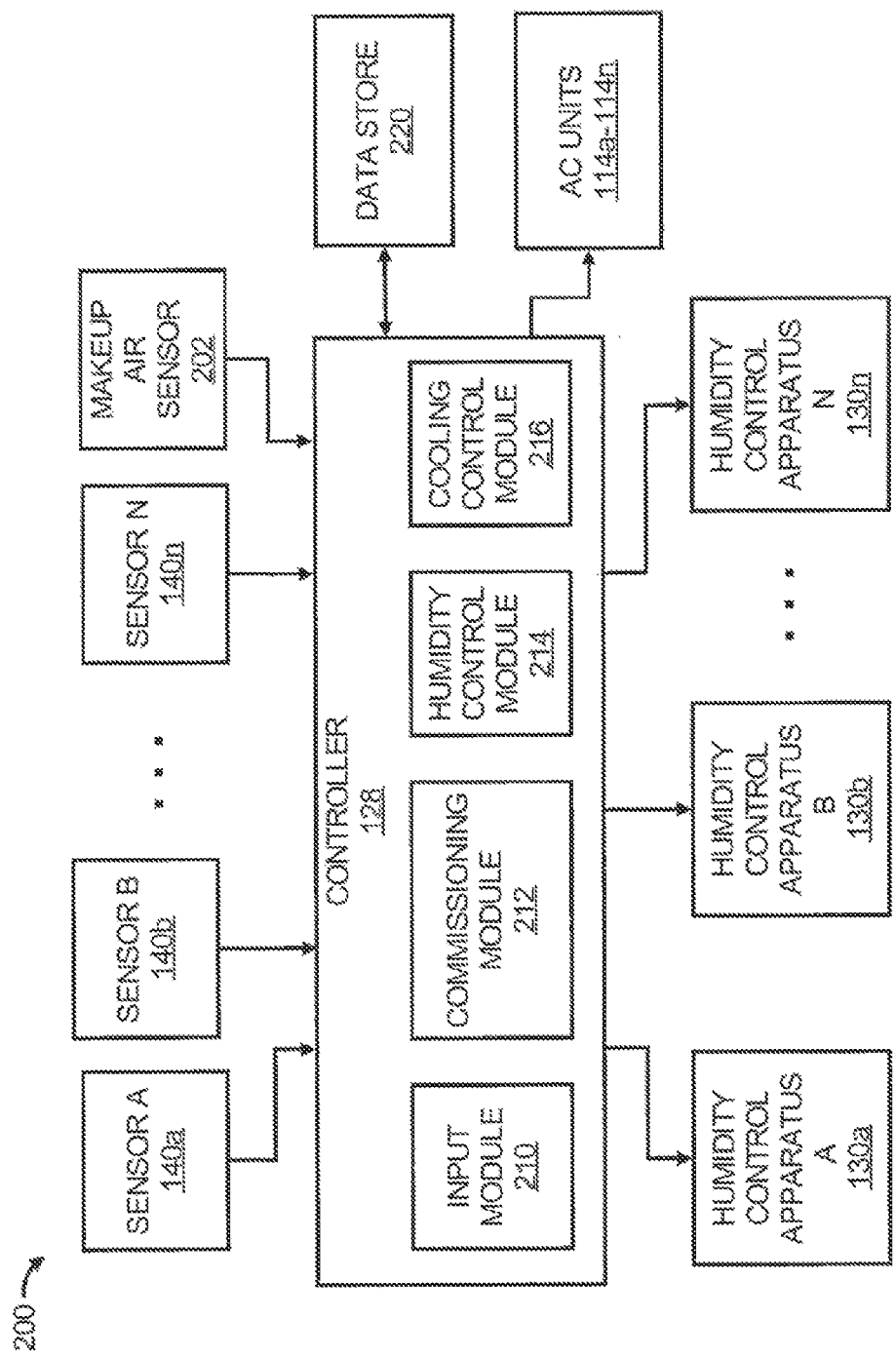
FIG. 2 shows a simplified block diagram of a system for controlling moisture content in ambient airflow in a substantially enclosed structure, according to an embodiment of the invention.

Turning now to FIG. 2, there is shown a simplified block diagram of a system 200 for controlling moisture content in ambient airflow in a substantially enclosed structure, according to an example. It should be understood that the system 200 may include additional elements and that some of the elements described herein may be removed and/or modified without departing from the scope of the system 200. In addition, the system 200 is described as including many of the components discussed above with respect to the substantially enclosed structure 100 depicted in FIGS. 1A and 1B. It should, however, be understood that the system 200 may be employed in an environment that differs from the those depicted in FIGS. 1A and 1B As shown, the system 200 includes the controller 128, which may comprise software, firmware, or hardware. The controller 128 is depicted as including an input module 210, a commissioning module 212, a humidity control module 214, and a cooling control module 216. The commissioning module 212 and the cooling control module 216 may be considered as optional modules for the controller 128 because these modules may not be implemented in every embodiment of the system 200. Instead, the commissioning module 212 and the cooling control module 216 may be implemented in various embodiments as discussed herein below.

In instances where the controller 128 comprises software, the controller 128 may be stored on a computer readable storage medium and may be executed by the processor of a computing device, such as one of the electronic components 116 depicted in FIG. 1A. In these instances, the modules 210-216 may comprise software modules or other programs or algorithms configured to perform the functions described herein below. In instances where the controller 128 comprises firmware or hardware, the controller 128 may comprise a circuit or other apparatus configured to perform the functions described herein. In these instances, the modules 210-216 may comprise one or more of software modules and hardware modules.

Thus, by way of example, the controller 128 may comprise a processor of a computing device and the modules 210-216 may comprise software stored on a computer readable storage medium. The computer readable storage medium may comprise the data store 220 or a separate storage device. In addition, the data store 220 may comprise volatile and/or nonvolatile memory, such as DRAM, EEPROM, MRAM, flash memory, and the like. In addition, or alternatively, the data store 220 may comprise a device configured to read from and write to a removable media, such as, a floppy disk, a CD-ROM, a DVD-ROM, or other optical or magnetic media.

In any regard, the controller 128 may be executed or implemented to control moisture content in ambient airflow in a substantially enclosed structure 100, such as, a building, a room, a data center, etc. More particularly, for instance, the controller 128 may be executed or implemented to substantially maintain moisture content levels in the ambient airflow within a predefined range. Various examples of manners in which the controller 128 may control moisture content are described herein below.

The controller 128 may implement or execute the input module 210 to receive input from a plurality of sensors 140*a*-140*n* configured to detect moisture content in airflow. The controller 128 may also execute the input module 210 to receive input from a makeup air sensor 202 positioned to detect the moisture content in the makeup air brought into the substantially enclosed structure 100 from the external environment. The controller 128 may store the data received from the plurality of sensors 140*a*-140*n* and the makeup air sensor 202 in the data store 220. As shown in FIG. 1A, the sensors 140*a*-140*n* are positioned at various locations throughout the substantially enclosed structure 100. More particularly, for instance, the sensors 140*a*-140*n* are positioned at various locations where the moisture content levels are to be controlled. By way of particular example, the sensors 140*a*-140*n* may be positioned at the inlets/outlets of the racks 102-108 containing the electronic components 116. In this regard, the sensors 140a-140n are positioned remotely from the humidity control apparatuses.

Although not shown, the input module 210 may also be configured to receive input from a plurality of other types of sensors, such as temperature sensors, pressure sensors, etc. According to an example, the controller 128 may utilize the input from the other types of sensors in controlling the AC units 114a-114n.

The controller 128 may implement or execute the commissioning module 212 to implement a commissioning process designed to identify which of a plurality of humidity control apparatuses 130a-130n varies moisture content in the airflow supplied to which of the one or more zones 132a-132n in the substantially enclosed structure 100. In addition, or alternatively, the commissioning module 212 may be implemented to determine which of the humidity control apparatuses 130a-130n varies moisture content to at least a predefined level and may identify the one or more zones 132a-132n based upon that determination.

The commissioning module 212 is considered to be optional because a commissioning process may not be required for every substantially enclosed structure 100 employing the system 200. For instance, the commissioning module 212 may be omitted in instances where the substantially enclosed structure 100 contains a single humidity control apparatus 130a. As another example, the commissioning module 212 may be omitted in instances where the controller 128 is configured to operate a plurality of humidity control apparatuses 130a-130n as a group.

The controller 128 is configured to implement or execute the humidity control module 214 to control the humidity control apparatuses 130a-130n. The controller 128 may implement or execute the humidity control module 214 in various manners as discussed herein below based upon, for instance, the configuration of the substantially enclosed structure 100.

The controller 128 is further configured to implement or execute the cooling control module 216 to control one or more of the AC units 114a-114n, as also described in greater detail herein below. The cooling control module 216 may be considered to be optional because control of the AC units 114a-114n may be performed by another controller or each of the AC units 114a-114n may operate substantially independently with respect to each other.

According to an example, the humidity control apparatuses 130a-130n are physically separate from the AC units 114a-114n. In this example, the humidity control apparatuses 130a-130n may be operated separately from the AC units 114a-114n. In other words, operations of the AC units 114a-114n are not intended to directly affect operations of the humidity control apparatuses 130a-130n or vice versa.

According to another example, at least one of the humidity control apparatuses 130a-130n is integrated with at least one of the AC units 114a-114n. In this example, the controller 128 may control both the integrated AC unit 114a and humidity control apparatus 130a in various manners to substantially optimize energy efficiency. By way of example, the controller 128 may control the integrated AC unit 114a and humidity control apparatus 130a, such that, when the integrated AC unit 114a is actively cooling, the humidity control apparatus 130a is not actively humidifying. Likewise, the controller 128 may control the integrated AC unit 114a and the humidity control apparatus 130a, such that, when the integrated AC unit 114a is actively heating, the humidity control apparatus 130a is not actively dehumidifying.

The controller 128 may implement a commissioning process to identify regions of influence for each of the AC units 114a-114n. A suitable commissioning process is disclosed in commonly assigned U.S. Pat. No. 7,117,129, filed on Mar. 11, 2005, and entitled "Commissioning of Sensors", the disclosure of which is hereby incorporated by reference in its entirety. In implementing the commissioning process, the controller 128 may determine that one or more of the AC units 114a-114n have regions of influence that substantially overlap with the regions of influence of one or more other AC units 114a-114n.

The controller 128 may determine which of the plurality of AC units 114a-114n have humidity control apparatuses 130a-130n, and that control a particular region, should be used for a particular type of humidity control given the state of temperature control of the AC units 114a-114n in the potential pool of AC units 114a-114n that control the particular region. By way of example, to dehumidify a particular region, the controller 128 may utilize the AC unit 114a that is operating at the lowest temperature as compared with a different AC unit 114b because the act of dehumidifying requires low temperature air, thus making this option more energy efficient than that of choosing the AC unit 114b that is supplying relatively higher temperature air.

Examples of methods in which the system 200 may be employed to control moisture content in ambient airflow in the substantially enclosed structure 100 will now be described with respect to the following flow diagram of the method 300 depicted in FIG. 3. It should be apparent to those of ordinary skill in the art that the method 300 represents a generalized illustration and that other steps may be added or existing steps may be removed, modified or rearranged without departing from the scopes of the method 300.

The description of the method 300 is made with reference to the system 200 illustrated in FIG. 2, and thus makes reference to the elements cited therein. It should, however, be understood that the method 300 is not limited to the elements set forth in the system 200. Instead, it should be understood that the method 300 may be practiced by a system having a different configuration than that set forth in the system 200.

The controller 128 may implement or execute one or more of the modules 210-216 to perform the method 300 in controlling the moisture content in ambient airflow of the substantially enclosed structure 100.

Figure 3:
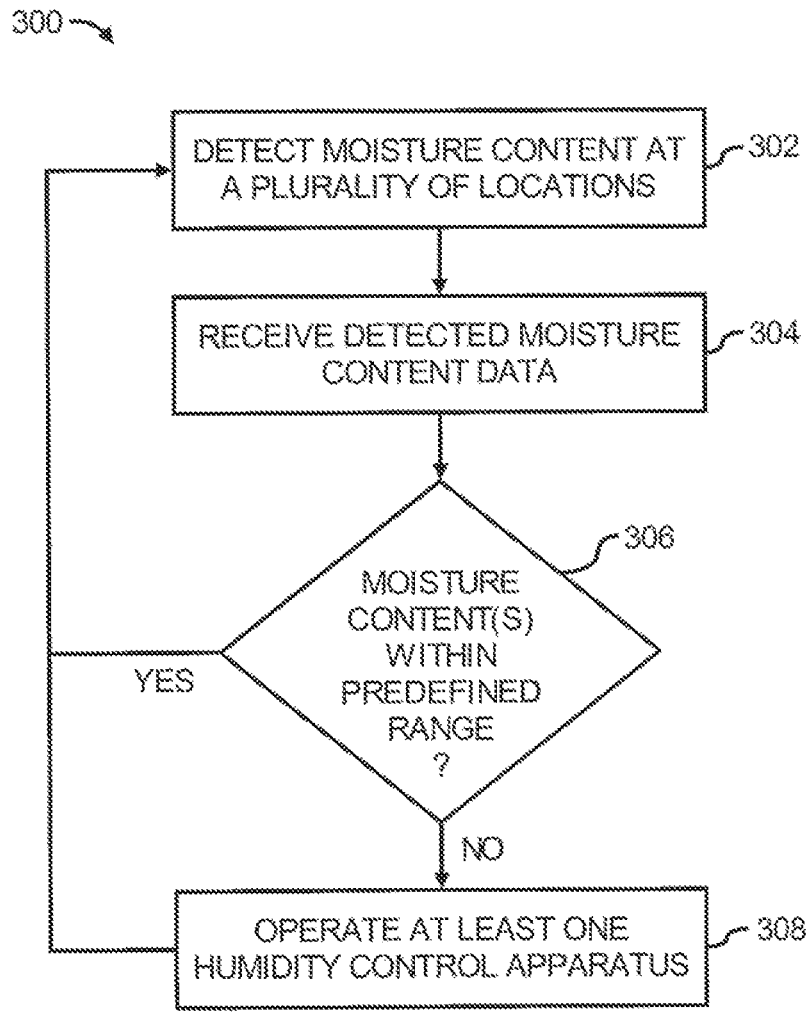
FIG. 3 illustrates a flow diagram of a method of controlling moisture content in ambient airflow in a substantially enclosed area with at least one humidity control apparatus, according to an embodiment of the invention.

FIG. 3, more particularly, shows a flow diagram of a method 300 of controlling moisture content in ambient airflow in a substantially enclosed structure 100 with at least one humidity control apparatus 130a, according to an example. As shown, moisture content or humidity, either relative humidity or absolute humidity, is detected at a plurality of locations in a substantially enclosed area 100 with a plurality of humidity sensors 140a-140n, as indicated at step 302.

As discussed above with respect to FIG. 1A, the humidity sensors 140a-140n are located remotely from the at least one humidity control apparatus 130a-130n. In addition, in instances where a plurality of humidity control apparatuses 130a-130n are employed in the system 200, the humidity sensors 140a-140n are also located remotely from each of the plurality of humidity control apparatuses 130a-130n. The humidity sensors 140a-140n are considered to be "located remotely" from the humidity control apparatuses 130a-130n because the humidity sensors 140a-140n are not located in close proximity to the humidity control apparatuses 130a-130n. In other words, the "located remotely" may be defined to include that the humidity sensors 140a-140n are located sufficiently distant from the humidity control apparatuses 130a-130n, such that, one or more environmental conditions may differ between the locations of the humidity control apparatuses 130a-130n and the humidity sensors 140a-140n. In addition, or alternatively, the "located remotely" may be defined to include that the humidity sensors 140a-140n are located in positions in the substantially enclosed structure 100 where the humidity control apparatuses 130a-130n are configured to vary the moisture content in the airflow supplied by the humidity control apparatuses 130a-130n. Thus, for instance, the "located remotely" may be defined to include that the humidity sensors 140a-140n are placed in any location from which air is received into the racks 102-108. These locations may include, for instance, at the inlets of the racks 102-108, in the space 112, in aisles containing vent tiles 118, etc.

At step 304, the controller 128 receives data pertaining to the moisture content detected by the humidity sensors 140a-140n. The controller 128 may process the data to determine whether the moisture content levels at the one or more locations are within a predefined moisture content range, as indicated at step 306. The predefined moisture content range may comprise an acceptable moisture content range for the components 116 positioned at the one or more locations, for instance, as set forth by the component 116 manufacturers, as identified through testing, as set forth in one or more standards, such as ASHRAE, etc. By way of example, the predefined range may be between about 20 to 80 percent. As another example, the predefined range may be between about 40 to 55 percent. The predefined range may depend, for instance, upon the sensitivities of the components 116 to moisture levels in the air.

According to an example, based upon the detected moisture content data received from the humidity sensors 140a-140n, the controller 128 may identify which areas in the substantially enclosed area 100 have moisture content levels that are within the predefined range and which areas have moisture content levels that are outside of the predefined range, at step 306. In this example, the controller 128 may determine which of the humidity control apparatuses 130a-130n is operable to vary the moisture content in the airflow contained in the various areas. An example of a manner in which the controller 128 may commission the humidity control apparatuses 130a-130n to identify their respective zones of influence is described herein below with respect to FIG. 4.

In any regard, for those areas where the moisture content is determined to be within the predefined range, which may include the entire area of the substantially enclosed structure 100, the controller 128 may not vary operations of the humidity control apparatuses 130a-130n. In addition, the moisture content at the plurality of locations may be detected again at step 302 and steps 304 and 306 may be repeated. However, for those areas where the moisture content is determined to be outside of the predefined range, which may again include the entire area of the substantially enclosed structure 100, the controller 128 may vary operations of one or more of the humidity control apparatuses 130a-130n that are operable to affect those areas, as indicated at step 308.

More particularly, at step 308, the controller 128 may vary operations of the one or more humidity control apparatuses 130a-130n by causing the one or more humidity control apparatuses 130a-130n to either increase or decrease the moisture content level in the airflow supplied to those areas. The one or more humidity control apparatuses 130a-130n may be controlled to increase moisture content in the airflow in response to the moisture content falling below the predefined range and to decrease moisture content in the airflow in response to the moisture content exceeding the predefined range.

In addition, once the operations of the one or more humidity control apparatuses 130a-130n have been varied at step 308, the moisture content at the plurality of locations may be detected again at step 302 and steps 304-308 may be repeated in a substantially continuous manner to enable the moisture content to be continuously monitored and adjusted.

According to another example in which airflow from the external environment is brought into the substantially enclosed structure 100, at step 302, the moisture content or humidity, either relative humidity or absolute humidity, of the airflow from the external environment is detected in addition to the moisture content at the plurality of locations. In addition, at step 304, the controller 128 receives data pertaining to the moisture content detected by the makeup air sensor 202. Furthermore, the controller 128 may consider the moisture content of the airflow received from the external environment in varying the operations of the one or more humidity control apparatuses 130a-130n at step 308. By way of example, if the moisture content in the airflow received from the external environment is relatively high and the amount of the air received from the external environment is relatively significant, the controller 128 may operate the one or more humidity control apparatuses 130a-130n relatively close to higher limits of humidity.

As another example, if the moisture content in the airflow received from the external environment is relatively high and the amount of the air received from the external environment is relatively significant, and the moisture content detected by the humidity sensors 140a-140n is below the predefined range at step 306, the controller 128 may cause a greater amount of airflow from the external environment to be brought into the substantially enclosed area 100. In addition, the controller 128 may vary in the amount of airflow brought into the substantially enclosed area 100 based upon the amount of humidity contained in the external environment. In one regard, the one or more humidity control apparatuses 130a-130n may be operated to consume relatively lesser amounts of energy by relying more heavily upon moisture content in the airflow brought in from the external environment to meet, for instance, OSHA or ASHRAE requirements.

Figure 4:
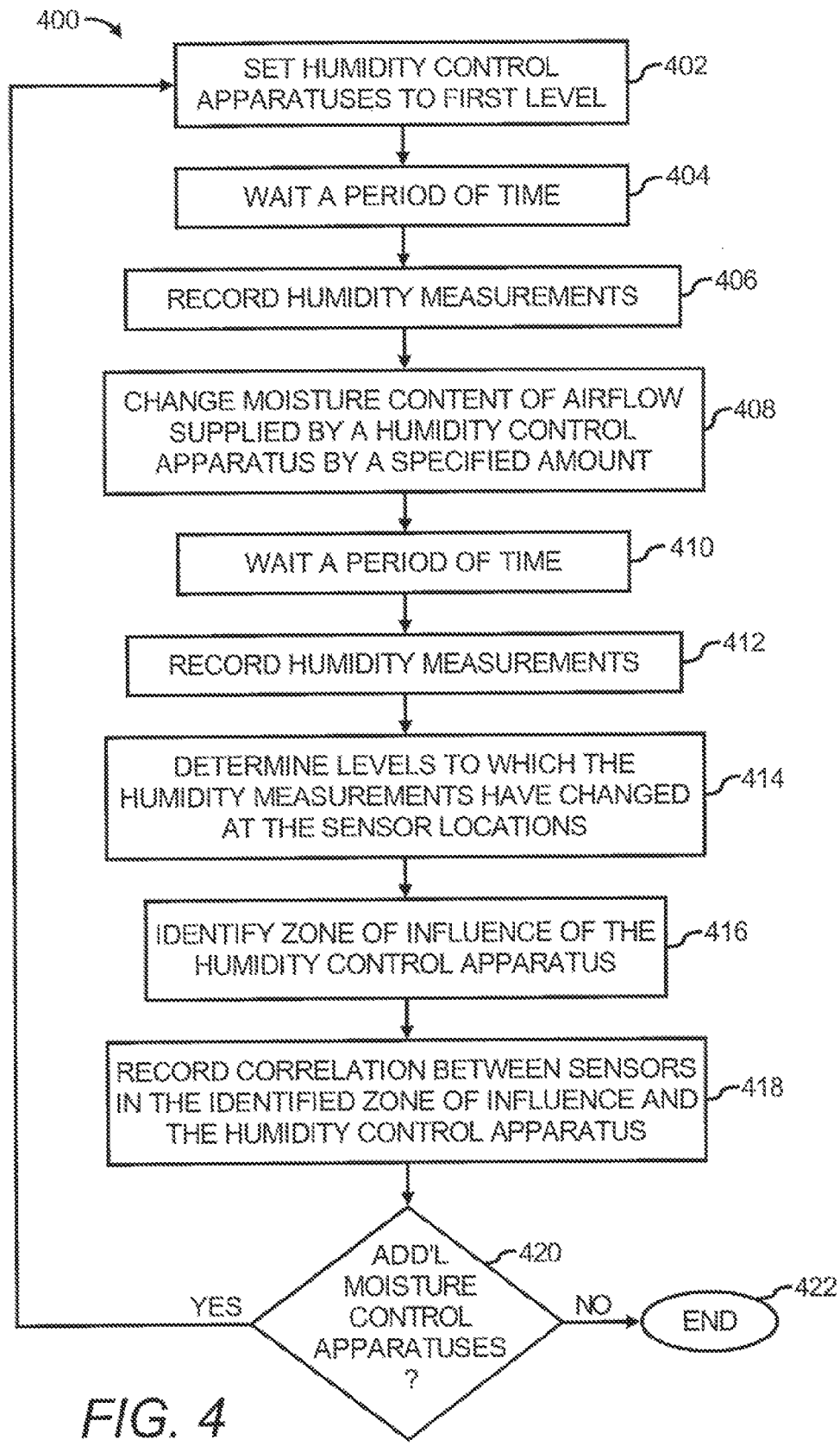
FIG. 4 illustrates a flow diagram of a method of commissioning the humidity control apparatuses and the sensors depicted in FIG. 2 to identify zones of influence for each of the humidity control apparatuses, according to an embodiment of the invention.

With reference now to FIG. 4, there is shown a flow diagram of a method 400 of commissioning the humidity control apparatuses 130a-130n and the sensors 140a-140n to identify zones of influence 132a-132n for each of the humidity control apparatuses 130a-130n. It should be apparent to those of ordinary skill in the art that the method 400 represents a generalized illustration and that other steps may be added or existing steps may be removed, modified or rearranged without departing from the scopes of the method 400.

The controller 128 may implement or execute the commissioning module 212 to perform the method 400 to identify which zones 132a-132n in the substantially enclosed structure 100 each of the humidity control apparatus 130a-130n respectively has at least a predetermined level of influence. Once the respective zones 132a-132n have been identified, each of the sensors 140a-140n may be associated with one or more of the humidity control apparatuses 130a-130n based upon which of the zones 132a-132n the sensors 140a-140n are located. That is, those sensors 140a-140n contained in a particular zone 132a are considered to be associated with the humidity control apparatus 130a that is associated with the particular zone 132a.

Generally speaking, in the method 400, each of the humidity control apparatuses 130a-130n is independently perturbed at different times, such as, in a sequential manner, by either injecting moisture into or removing moisture from the airflow supplied by the humidity control apparatuses 130a-130n. The responses of the humidity sensors 140a-140n to the perturbations are measured and recorded as a function of time. Those humidity sensors 140a-140n recording a rate of change of moisture greater than a predefined threshold are considered to reside within that humidity control apparatus' zone 132a-132n.

More particularly, at step 402, the controller 128 may set the humidity control apparatuses 130a-130n to a first level. The first level may include, for instance, a humidity output level that is common to all of the humidity control apparatuses 130a-130n. The controller 128 may wait for a period of time at step 404 prior to recording humidity measurements obtained by the humidity sensors 140a-140n at step 406. The controller 128 may allow this time period to elapse in order to enable a relatively steady-state of operation to be reached. In addition, during the time period at step 406, the controller 128 may determine a median humidity reading for one or more of the humidity sensors 140a-140n in the event that the humidity levels detected by one or more of the humidity sensors 140a-140n oscillate during the time period. In this case, the humidity measurements recorded at step 406 may comprise time-averaged values.

At step 408, the controller 128 may control a humidity control apparatus 130a to change the moisture content in the airflow by a specified amount. The specified amount may comprise an amount that differs from the first level moisture content by a relatively discernable amount. The controller 128 may again wait for a period of time at step 410, prior to recording humidity information received from the humidity sensors 140a-140n at step 412. The controller 128 may allow this time period to elapse in order to enable a relatively steady-state of operation to be reached following the moisture content change in the airflow supplied by one of the humidity control apparatuses 130a. In addition, during the time period at step 410, the controller 128 may determine a median humidity reading for one or more of the humidity sensors 140a-140n in the event that the humidity levels detected by one or more of the humidity sensors 140a-140n oscillate during the time period. In this case, the humidity measurements recorded at step 412 may comprise time-averaged values.

In any regard, at step 414, the controller 128 may determine the levels to which the humidity measurements have changed at the humidity sensor 140a-140n locations from the humidity measurements recorded at step 412. More particularly, for instance, the controller 128 may compare the humidity measurements recorded at step 406 with those recorded at step 412 to determine whether there have been discernable changes in the humidity levels and to what degree the changes have occurred.

At step 416, the controller 128 identifies the zone of influence of the humidity control apparatus 130a that was perturbed at step 408. The controller 128 may make this determination based upon the degrees to which the humidity levels have changed as detected by the humidity sensors 140a-140n. By way of example, the controller 128 may calculate humidity correlation indices (HCIs) for the humidity control apparatuses 130a-130n. The HCI for a humidity control apparatus 130a and a humidity sensor 140a may be defined as the change in humidity detected by the humidity sensor 140a following a change in humidity of the airflow supplied by the humidity control apparatus 130a.

The controller 128 may also identify which of the humidity sensors 140a-140n detected changes in humidity levels that exceed a predefined level. The predefined level may be set based upon any of a number of various factors, such as, the sensitivity levels of each the humidity sensors 140a-140n, the distribution of the identified zones 132a-132n, etc. In addition, the locations of the humidity sensors 140a-140n whose detected humidity levels have changed beyond the predefined level may be identified as the zone 132a associated with that humidity control apparatus 130a.

According to an example, the method 400 may be performed during actual operations of the humidity control apparatuses 130a-130n instead of as a separate operation, to identify which zones 132a-132n in the substantially enclosed structure 100 each of the humidity control apparatuses 130a-130n respectively has at least a predetermined level of influence. In this example, the method 400 may be implemented in instances where the humidity control apparatuses 130a-130n are not sufficiently varying humidity levels to enable adequate readings during normal operations.

A more detailed description of various manners in which the zones of influence 132a-132n for various actuators may be identified based upon sensor measurements may be found in U.S. Pat. No. 7,117,129.

At step 418, the controller 128 records the correlation between the humidity sensors 140a-140n contained in the identified zone of influence 132a and the humidity control apparatus 130a. In other words, the controller 128 records that the humidity control apparatus 130a has at least a predefined level of influence over their correlated humidity sensors 140a-140n, and thus, at least a predefined level of influence over the respective locations of the correlated humidity sensors 140a-140n.

At step 420, the controller 128 determines whether the method 400 should be repeated for another humidity control apparatus 130b. If it is determined that an additional correlation between the another humidity control apparatus 130b and the humidity sensors 140a-140n are to be determined, the humidity levels in the airflow supplied by the humidity control apparatuses 130a-130n may again be set to the first level at step 402. Following step 402, the controller 128 may again wait for a period of time at step 404, prior to recording humidity information received from the humidity sensors 140a-140n at step 406, as described above. In addition, the controller 128 may repeat steps 402-420 to identify and record correlations between the humidity control apparatuses 130a-130n and the humidity sensors 140a-140n. The method 400 may end, as indicated at step 422, once the controller 128 determines that there are no further humidity control apparatuses 130a-130n remaining to be commissioned.

According to an example, instead of waiting for the periods of time to enable the conditions at the humidity sensors 140a-140n to reach steady-state conditions at steps 404 and 410, changes in the humidity measurements may be recorded at steps 406 and 412 as functions of time. In this example, at steps 406 and 412, the change in humidity (dH) as a function of a change in time (dt) may be measured, for instance, as dH/dt. In addition, correlations between the humidity control apparatuses 130a-130n and the humidity sensors 140a-140n may be made based upon whether the dH/dt measurements for the humidity sensors 140a-140n exceed a predetermined dH/dt threshold at step 414. The correlations may be used to identify the zones of influence for each of the humidity control apparatuses 130a-130n at step 416.

Through implementation of the method 400 and alternate examples discussed above, the controller 128 may relatively quickly identify which of the humidity control apparatuses 130a-130n to actuate in response to a determination that the moisture content level in one or more locations of the substantially enclosed structure 100 is outside of a predefined humidity range. Because some of the zones 132a-132n may overlap with each other, there may arise instances where one or more of the humidity sensors 140a-140n reside in more than one of the zones 132a-132n. As such, the controller 128 may select from a plurality of humidity control apparatuses 130a-130n in varying the humidity levels at the humidity sensors 140a-140n in the overlapping zones 132a-132n.

According to an example, the controller 128 may randomly select one or more of the humidity control apparatuses 130a-130n to actuate when one or more of the humidity sensors 140a-140n is outside of the predefined humidity range. According to another example, the controller 128 may select all of the humidity control apparatuses 130a-130n having a predefined level of influence over the one or more humidity sensors 140a-140n in the zone 132a to actuate when the one or more of the humidity sensors 140a-140n are outside of the predefined humidity range. According to a further example, the controller 128 may select the humidity control apparatus 130a having the greatest margin within which to vary humidity levels. In any of these examples, when multiple humidity control apparatuses 130a-130n are actuated, each of the multiple humidity control apparatuses 130a-130n may be actuated to a level that is relatively lower than would be performed with a single humidity control apparatus 130a.

In instances where multiple humidity control apparatuses 130a-130n are able to affect the same humidity sensors 140a-140n, there is a potential for fighting among the humidity control apparatuses 130a-130n. More particularly, for instance, one of the humidity control apparatuses 130a may currently be adding moisture content into the airflow based upon the humidity level detected by a humidity sensor 140a (located in zone 132a), another of the humidity control apparatuses 130b may currently be removing moisture content from the airflow based upon the humidity level detected by a humidity sensor 140b (located in zone 132b), and a further sensor 140c may be located in both zones 132a and 132b of the humidity control apparatuses 130a and 130b. In this example, if the humidity sensor 140c detects a humidity level that is below the predefined level, the controller 128 may determine which of the humidity control apparatuses 130a and 130b to actuate in order to substantially prevent the humidity control apparatuses 130a and 130b from consuming excess energy in both humidifying and dehumidifying the location at which the humidity sensor 140c is located.

More particularly, for instance, the controller 128 may implement the commissioning module 212 to identify control sensors for each of the zones 132a-132n. The control sensors may be defined as the humidity sensors 140a-140n with the largest positive humidity difference from a set point humidity in each of the zones 132a-132n. If all of the humidity sensors 140a-140n have negative humidity differences from the set point humidity, then the control sensor for a particular zone 132a-132n is the humidity sensor 140a-140n with the largest negative difference from the set point humidity. The set point humidity used to determine the control sensor may vary between the humidity sensors 140a-140n and is thus not required to be identical for all of the humidity sensors 140a-140n.

In general, the controller 128 is configured to control the humidity control apparatuses 130a-130n to modify the humidity levels in the zones 132a-132n based upon the humidity levels of the control sensors. As such, in the example above, the controller 128 may control either or both of the humidity control apparatus 130a and the humidity control apparatus 130b based upon the humidity level detected by the humidity sensor 140c if the humidity sensor 140c is the control sensor for either or both of the humidity control apparatuses 130a and 130b. If the humidity sensor 140c is not a control sensor for either of the zones 132a or 132b, the controller 128 may continue to operate the humidity control apparatuses 130a and 130b based upon the detected humidity information the control sensors in their respective zones 132a and 132b.

A more detailed discussion of control sensors, actuators, and actuator families and various manners in which they are identified, controlled, and modified are discussed in U.S. Pat. No. 7,117,129 and in commonly owned and co-pending U.S. patent application Ser. No. 11/089,608 (Attorney Docket No. 200500812-1), filed on Mar. 25, 2005, and entitled "Temperature Control Using a Sensor Network", the disclosures of which is hereby incorporated by reference in its entireties.

According to a further example, the controller 128 may also control a plurality of AC units 114a-114n to operate in manners that substantially minimizes energy waste in terms of humidity control. More particularly, for instance, the controller 128 may control the plurality of AC units 114a-114n to substantially prevent them from operating at cross purposes, which results in wasted energy. Typically, the AC units 114a-114n equipped with humidifiers/dehumidifiers operate by dehumidifying airflow when they are cooling and by humidifying airflow when they are heating airflow. Thus, the AC units 114a-114n may be considered as operating at cross purposes when, for instance, the AC units 114a-114n are heating up and de-humidifying the airflow or when they are cooling and humidifying the airflow.

In order to substantially avoid this problem, the controller 128 is configured to identify the zones 132a-132n over which the AC units 114a-114n have a predefined level of influence, as discussed above with respect to the commissioning of the humidity control apparatuses 130a-130n and the sensors 140a-140n. In zones 132a-132n that overlap each other, the controller 128 is configured to control the AC units 114a-114n, such that, if a particular zone 132a requires both cooling and humidification, one of the AC units 114a is used to cool the airflow and another of the AC units 114b is used to humidify the airflow. In this regard, the AC units 114a-114n may be operated in manners that substantially avoid the cross-purposes discussed above while substantially maintaining desired conditions.

Some or all of the operations set forth in the methods 300 and 400 may be contained as utilities, programs, or subprograms, in any desired computer accessible medium. In addition, the methods 300 and 400 may be embodied by computer programs, which can exist in a variety of forms both active and inactive. For example, they may exist as software program(s) comprised of program instructions in source code, object code, executable code or other formats. Any of the above may be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
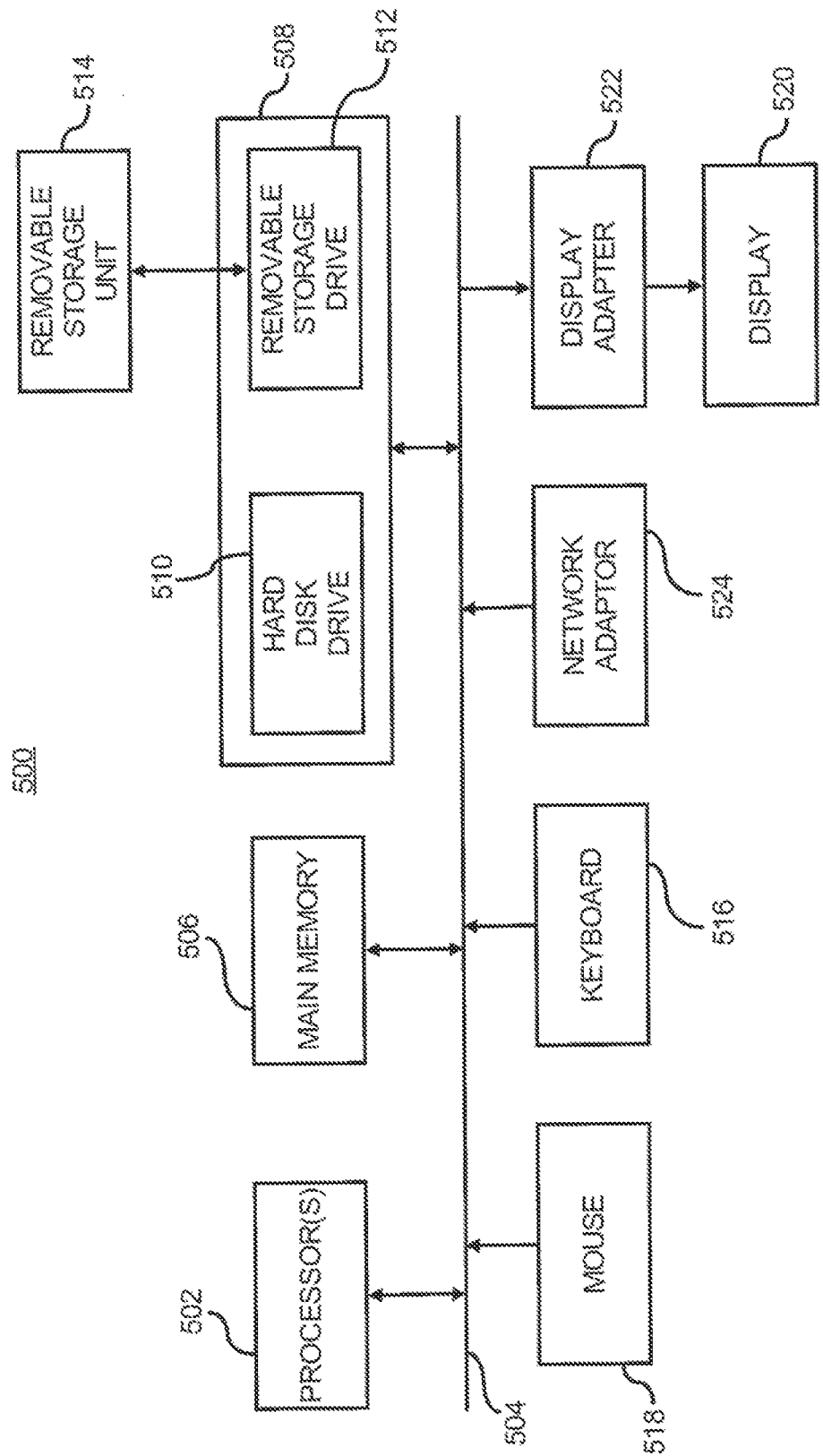
FIG. 5 shows a block diagram of a computing apparatus configured to implement or execute the controller depicted in FIG. 2, according to an embodiment of the invention.

FIG. 5 illustrates a block diagram of a computing apparatus 500 configured to implement or execute the controller 128 depicted in FIGS. 1A and 2, according to an example. In this respect, the computing apparatus 500 may be used as a platform for executing one or more of the functions described hereinabove with respect to the controller 128.

The computing apparatus 500 includes a processor 502 that may implement or execute some or all of the steps described in the methods 300 and 400. Commands and data from the processor 502 are communicated over a communication bus 504. The computing apparatus 500 also includes a main memory 506, such as a random access memory (RAM), where the program code for the processor 502, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the methods 300 and 400 may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor(s) 502 may communicate over a network, for instance, the Internet, LAN, etc., through a network adaptor 524.

It will be apparent to one of ordinary skill in the art that other known electronic components may be added or substituted in the computing apparatus 500. It should also be apparent that one or more of the components depicted in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the scope of the invention, which is intended to be defined by the following claims—and their equivalents—in which all terms are meant in their broadest reasonable sense unless otherwise indicated.

What is claimed is:

1. A system for controlling moisture content in ambient airflow in a substantially enclosed structure having components, said system comprising:
    at least one humidity control apparatus;
    a plurality of sensors for detecting moisture content in airflow in a plurality of locations of the substantially enclosed structure, wherein the plurality of sensors are located remotely from the at least one humidity control apparatus, and wherein the plurality of sensors are situated in relatively close proximity to the components that the at least one humidity control apparatus is configured to affect; and
    a controller configured to receive moisture content levels detected by one or more of the plurality of sensors and to control the at least one humidity control apparatus based upon the detected moisture content levels to vary the moisture content in the ambient airflow around the plurality of locations.

2. The system according to claim 1, wherein the substantially enclosed structure comprises a data center having a plurality of racks, and wherein the plurality of sensors are positioned to detect moisture content in at least one of the airflow supplied into and airflow exhausted from one or more of the plurality of racks.

3. The system according to claim 1, further comprising:
    a plurality of humidity control apparatuses, wherein each of the plurality of humidity control apparatuses is configured supply respective zones of the substantially enclosed structure with airflow, wherein the zones are capable of overlapping with one another; and
    wherein the controller is configured to control each of the plurality of humidity control apparatuses independently with respect to each other.

4. The system according to claim 3, wherein the controller is further configured to identify which of the plurality of sensors is located in which of the zones and thereby identify which of the plurality of humidity control apparatuses has at least a predefined level of influence over which of the plurality of sensors through a commissioning process.

5. The system according to claim 4, wherein the controller is further configured to identify a control sensor for each of the zones, and wherein the controller is configured to base control decisions of the plurality of humidity control apparatuses on the humidity level detected by the control sensor.

6. The system according to claim 1, further comprising:
    an air conditioning unit, wherein the at least one humidity control apparatus is physically separate from the air conditioning unit, and wherein the controller is configured to control the at least one humidity control apparatus separately from the air conditioning unit.

7. The system according to claim 1, further comprising:
    an air conditioning unit, wherein the at least one humidity control apparatus is integrated with the air conditioning unit, wherein the controller is configured to control both the air conditioning unit and the at least one humidity control apparatus in one or more manners to substantially optimize energy efficiency.

8. The system according to claim 7, further comprising:
    a plurality of air conditioning units, wherein each of the plurality of air conditioning units is integrated with a humidity control apparatus, wherein at least two of the air conditioning units are operable to vary conditions in a same zone of the substantially enclosed structure, and wherein the controller is further configured to operate the at least two of the air conditioning units in manners to substantially prevent the at least two of the air conditioning units from operating at cross purposes.

9. The system according to claim 1, further comprising:
    a makeup air sensor configured to detect moisture content levels in an environment external to the substantially enclosed structure; and
    wherein the controller is further configured to receive moisture content level detected by the makeup air sensor and to control the at least one humidity control apparatus based upon the detected moisture content level in varying the moisture content in the ambient airflow around the plurality of locations.

10. A method of controlling moisture content in ambient airflow in a substantially enclosed structure with at least one humidity control apparatus, said method comprising:
    detecting moisture content in airflow at a plurality of locations in the substantially enclosed area with a plurality of humidity sensors, wherein the plurality of humidity sensors are located remotely from the at least one humidity control apparatus, and wherein the plurality of sensors are situated in relatively close proximity to components in the substantially enclosed structure that the at least one humidity control apparatus is configured to affect;
    receiving data pertaining to the moisture content detected at the plurality of locations; and operating the at least one humidity control apparatus to vary the moisture content of airflow supplied to the one or more of the plurality of locations.

11. The method according to claim 10, further comprising:
determining whether the moisture content at one or more of the plurality of locations is within a predefined range; and
wherein operating the at least one humidity control apparatus further comprises varying the moisture content in airflow supplied to the one or more of the plurality of locations in response to the moisture content being outside of the predefined range.

12. The method according to claim 10, wherein the substantially enclosed structure comprises a data center having a plurality of racks, and wherein detecting the moisture content further comprises detecting the moisture content at either or both of an inlet and an outlet of at least one of the plurality of racks.

13. The method according to claim 10, wherein the substantially enclosed structure comprises a plurality of humidity control apparatuses, said method further comprising:
commissioning the plurality of humidity control apparatuses and the plurality of sensors to identify which of the plurality of sensors is located in which zones and thereby identify which of the plurality of humidity control apparatuses has at least a predefined level of influence over which of the plurality of sensors; and
operating the plurality of humidity control apparatuses independently with respect to each other to supply respective zones of the substantially enclosed structure with airflow, wherein the zones are capable of overlapping with one another.

14. The method according to claim 13, wherein commissioning the plurality of humidity control apparatuses further comprises identifying a control sensor for each of the zones, and wherein operating the plurality of humidity control apparatuses independently further comprises independently operating the plurality of humidity control apparatuses based upon the humidity levels detected by the respective control sensors.

15. The method according to claim 14, wherein identifying a control sensor for each of the zones further comprises choosing as the control sensor, the sensor of the plurality of sensors having one of the highest positive humidity difference from a set point humidity and the largest negative difference from the set point humidity.

16. The method according to claim 10, wherein the substantially enclosed structure includes an air conditioning unit, the method further comprising:
operating the air conditioning unit and the at least one humidity control apparatus independently with respect to each other.

17. The method according to claim 10, wherein the substantially enclosed structure includes a plurality of air conditioning units, wherein each of the plurality of air conditioning units includes a humidity control apparatus, and at least two of the air conditioning units are operable to vary conditions in a same zone of the substantially enclosed structure, the method further comprising:
operating the at least two of the air conditioning units in manners to substantially prevent the at least two of the air conditioning units from operating at cross purposes.

18. The method according to claim 10, further comprising:
receiving airflow from an environment external to the substantially enclosed structure;
detecting moisture content in airflow from the external environment;
receiving data pertaining to the moisture content detected in the airflow from the external environment; and
wherein operating the at least one humidity control apparatus further comprises factoring the moisture content detected in the airflow from the external environment in operating the at least one humidity control apparatus to vary the moisture content of airflow supplied to the one or more of the plurality of locations.

19. A method of controlling moisture content in ambient airflow with at least two air conditioning units operable to vary conditions in a same zone of a substantially enclosed structure, each of said air conditioning units having a respective humidity control apparatus, said method comprising:
operating a first air conditioning unit to supply airflow;
operating the humidity control apparatus of the first air conditioning unit to not operate under cross purposes as the first air conditioning unit;
operating a second air conditioning unit to supply airflow; and
operating the humidity control apparatus of the second air conditioning unit to operate under cross purposes as the first air conditioning unit.

20. A computer readable storage medium on which is embedded one or more computer programs, said one or more computer programs implementing a method of controlling moisture content in ambient airflow in a substantially enclosed structure with at least one humidity control apparatus, said one or more computer programs comprising a set of instructions for:
receiving data pertaining to moisture content detected at a plurality of locations in the substantially enclosed area with a plurality of humidity sensors, wherein the plurality of humidity sensors are located remotely from the at least one humidity control apparatus, and wherein the plurality of sensors are situated in relatively close proximity to components in the substantially enclosed structure that the at least one humidity control apparatus is configured to affect;
determining whether the moisture content at one or more of the plurality of locations is within a predefined range; and
operating the at least one humidity control apparatus to vary the moisture content of airflow supplied to the one or more of the plurality of locations in response to the moisture content being outside of a predefined range.

21. The computer readable storage medium according to claim 20, wherein the substantially enclosed structure comprises a plurality of humidity control apparatuses, said one or more computer programs further comprising a set of instructions for:
commissioning the plurality of humidity control apparatuses and the plurality of sensors to identify which of the plurality of sensors are located in which zones and thereby identify which of the plurality of humidity control apparatuses has at least a predefined level of influence over which of the plurality of sensors; and
operating the plurality of humidity control apparatuses independently with respect to each other to supply respective zones of the substantially enclosed structure with airflow based upon the commissioning, wherein the zones are capable of overlapping with one another.

* * * * *